US009622391B2

(12) United States Patent
Lee et al.

(10) Patent No.: US 9,622,391 B2
(45) Date of Patent: Apr. 11, 2017

(54) MOBILE TERMINAL

(71) Applicant: LG ELECTRONICS INC., Seoul (KR)

(72) Inventors: Joseph Lee, Seoul (KR); Byungsoo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/882,168

(22) Filed: Oct. 13, 2015

(65) Prior Publication Data

US 2017/0006738 A1    Jan. 5, 2017

(30) Foreign Application Priority Data

Jul. 1, 2015 (KR) .......................... 10-2015-0093900

(51) Int. Cl.
- H05K 7/20 (2006.01)
- H05K 5/00 (2006.01)
- H05K 1/14 (2006.01)
- G02F 1/1345 (2006.01)
- H04B 1/3888 (2015.01)

(52) U.S. Cl.
CPC ..... H05K 7/20963 (2013.01); G02F 1/13452 (2013.01); H05K 1/148 (2013.01); H05K 5/0017 (2013.01); H04B 1/3888 (2013.01); H05K 2201/041 (2013.01); H05K 2201/05 (2013.01); H05K 2201/10128 (2013.01)

(58) Field of Classification Search
CPC .......................... H05K 7/20963; G02F 1/13452
USPC ..................................................... 349/58–60
See application file for complete search history.

(56) References Cited

U.S. PATENT DOCUMENTS

| 5,293,262 A * | 3/1994 | Adachi ............... G02F 1/13452 257/E25.011 |
| 6,324,055 B1 | 11/2001 | Kawabe |

(Continued)

FOREIGN PATENT DOCUMENTS

EP    2843501    3/2015

OTHER PUBLICATIONS

European Patent Office Application Serial No. 16150214.1, Search Report dated Dec. 7, 2016, 7 pages.

*Primary Examiner* — Adrian S Wilson

(74) *Attorney, Agent, or Firm* — Lee Hong Degerman Kang & Waimey

(57) ABSTRACT

There is disclosed a mobile terminal including a display unit comprising a drive IC provided in a predetermined portion, a frame provided in a rear surface of the display unit, a flexible printed circuit board having one portion connected to the drive IC of the display unit and the other portion bent toward the rear surface of the display unit, a main board coupled to the frame and configured to control the drive IC via the flexible printed circuit board, and a heat transfer sheet configured to cover a front surface of the display unit and a predetermined portion of the first surface of the flexible printed circuit board, wherein at least predetermined portion of the heat transfer sheet is in contact with the frame, so that the heat generated in the drive IC and the light source of the display unit may be transferred to the frame and that the performance deterioration of the mobile terminal caused by the local overheat may be reduced and the difficulty in the user's holding the mobile terminal may be also reduced.

17 Claims, 16 Drawing Sheets

(56) References Cited

U.S. PATENT DOCUMENTS

| | | | |
|---|---|---|---|
| 6,366,264 B1 * | 4/2002 | Kurumada | G02F 1/13452 315/169.4 |
| 6,522,543 B2 * | 2/2003 | Kurihara | G02F 1/13452 165/185 |
| 6,534,722 B2 * | 3/2003 | Takaoka | H05K 7/20963 174/254 |
| 6,597,113 B1 * | 7/2003 | Nitta | H01J 11/12 313/48 |
| 6,677,664 B2 * | 1/2004 | Inoue | H05K 7/20963 257/668 |
| 6,703,702 B2 * | 3/2004 | Inoue | H01L 23/057 257/584 |
| 6,972,963 B1 * | 12/2005 | Chou | H01L 23/4985 174/252 |
| 7,034,220 B2 * | 4/2006 | Kim | H05K 9/0096 174/385 |
| 7,095,461 B2 * | 8/2006 | Kim | G02F 1/133308 349/58 |
| 7,372,699 B2 * | 5/2008 | Kim | G06F 1/1601 313/44 |
| 7,372,704 B2 * | 5/2008 | Jeong | H05K 5/02 348/836 |
| 7,481,567 B2 * | 1/2009 | Cho | G02B 6/0068 349/58 |
| 7,586,744 B2 * | 9/2009 | Okuda | G02F 1/133308 313/582 |
| 2004/0135936 A1 * | 7/2004 | Lee | G02B 6/0043 349/64 |
| 2005/0047067 A1 * | 3/2005 | Bang | H05K 7/20963 361/679.21 |
| 2005/0078446 A1 * | 4/2005 | Bae | G06F 1/1601 361/679.52 |
| 2005/0083646 A1 * | 4/2005 | Bae | G06F 1/1601 361/679.21 |
| 2008/0043413 A1 * | 2/2008 | Okuda | G02F 1/133308 361/679.01 |
| 2012/0044635 A1 | 2/2012 | Rothkopf et al. | |
| 2013/0271425 A1 * | 10/2013 | Kurashima | G06F 3/044 345/174 |
| 2015/0342089 A1 * | 11/2015 | Kim | H05K 7/20336 361/700 |

* cited by examiner

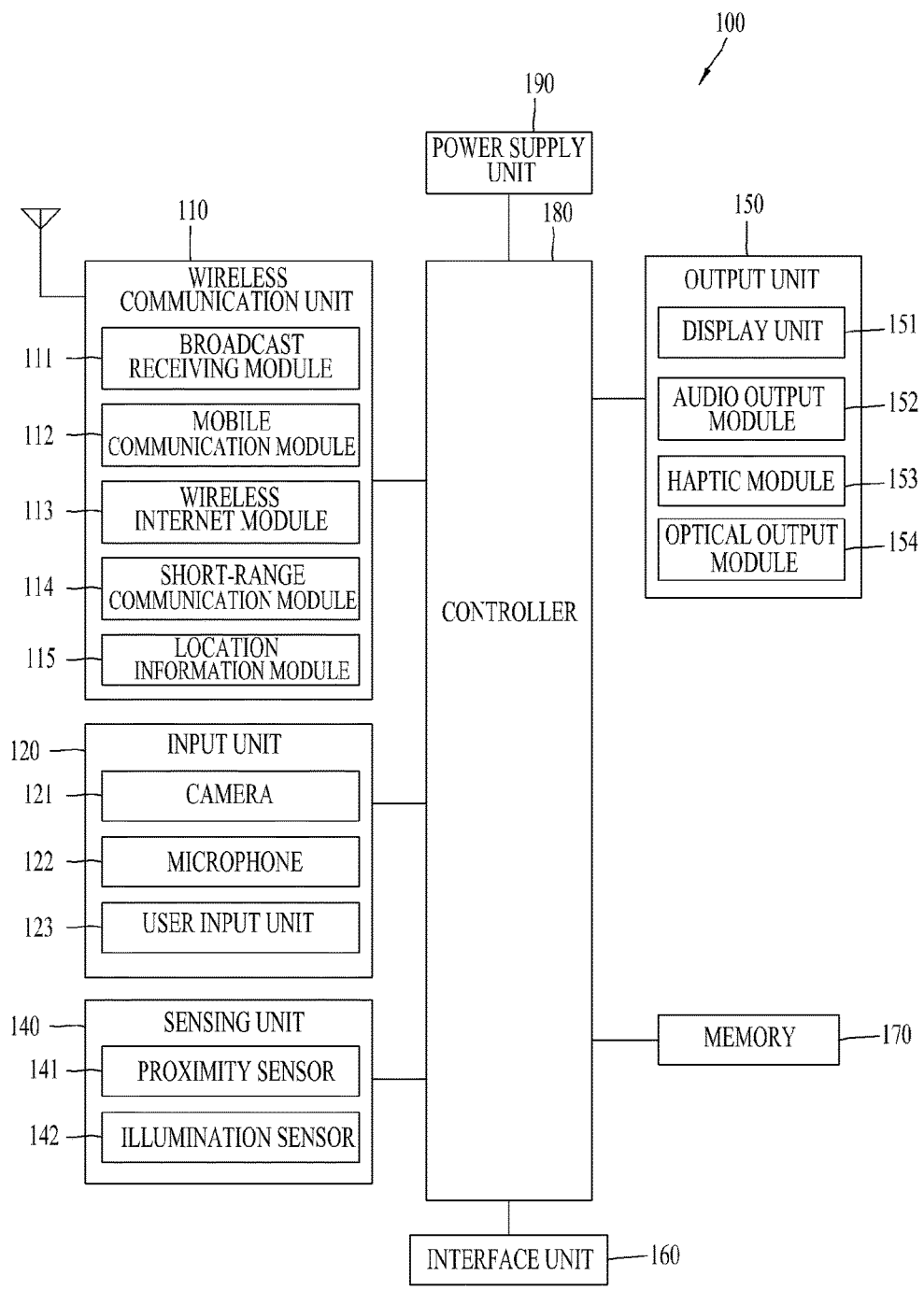

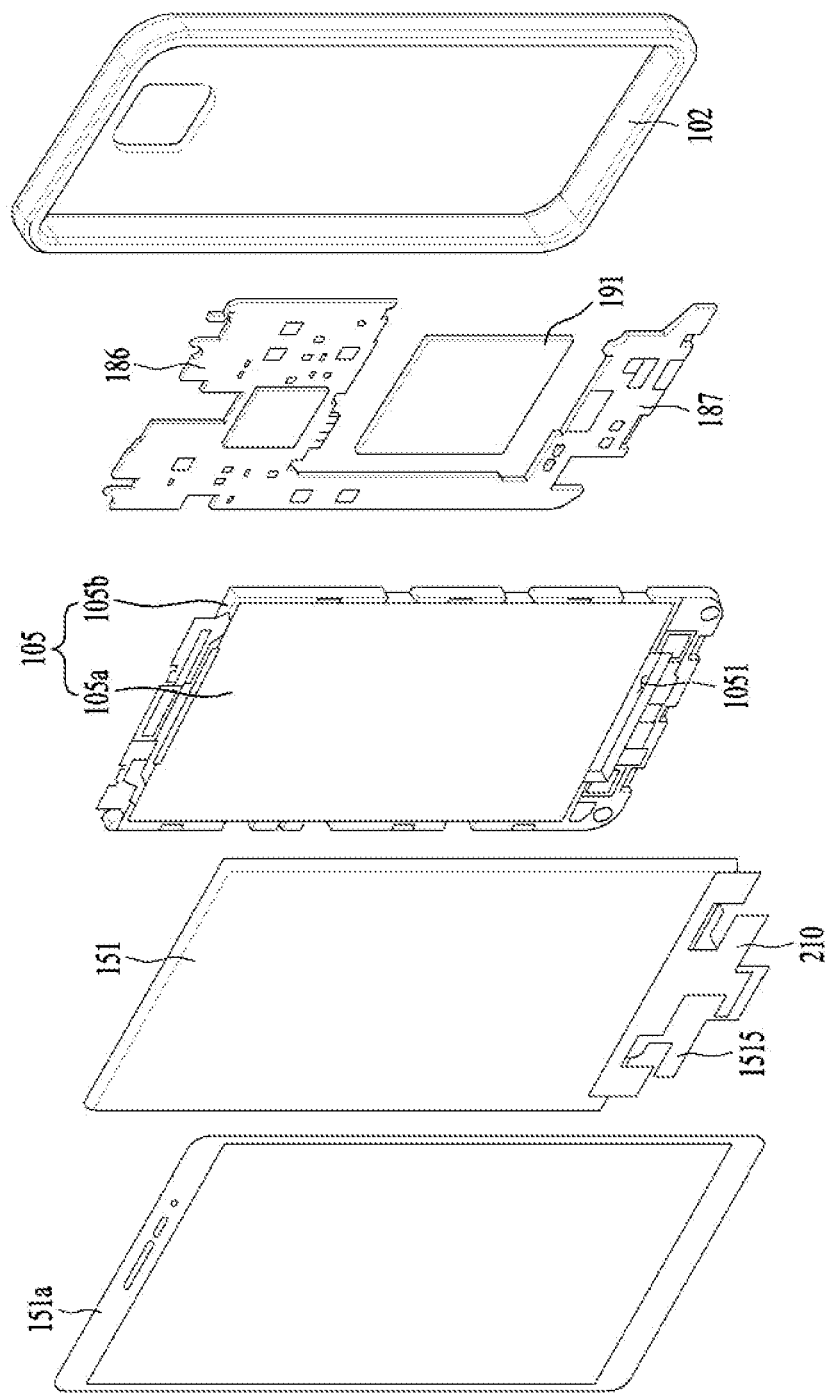

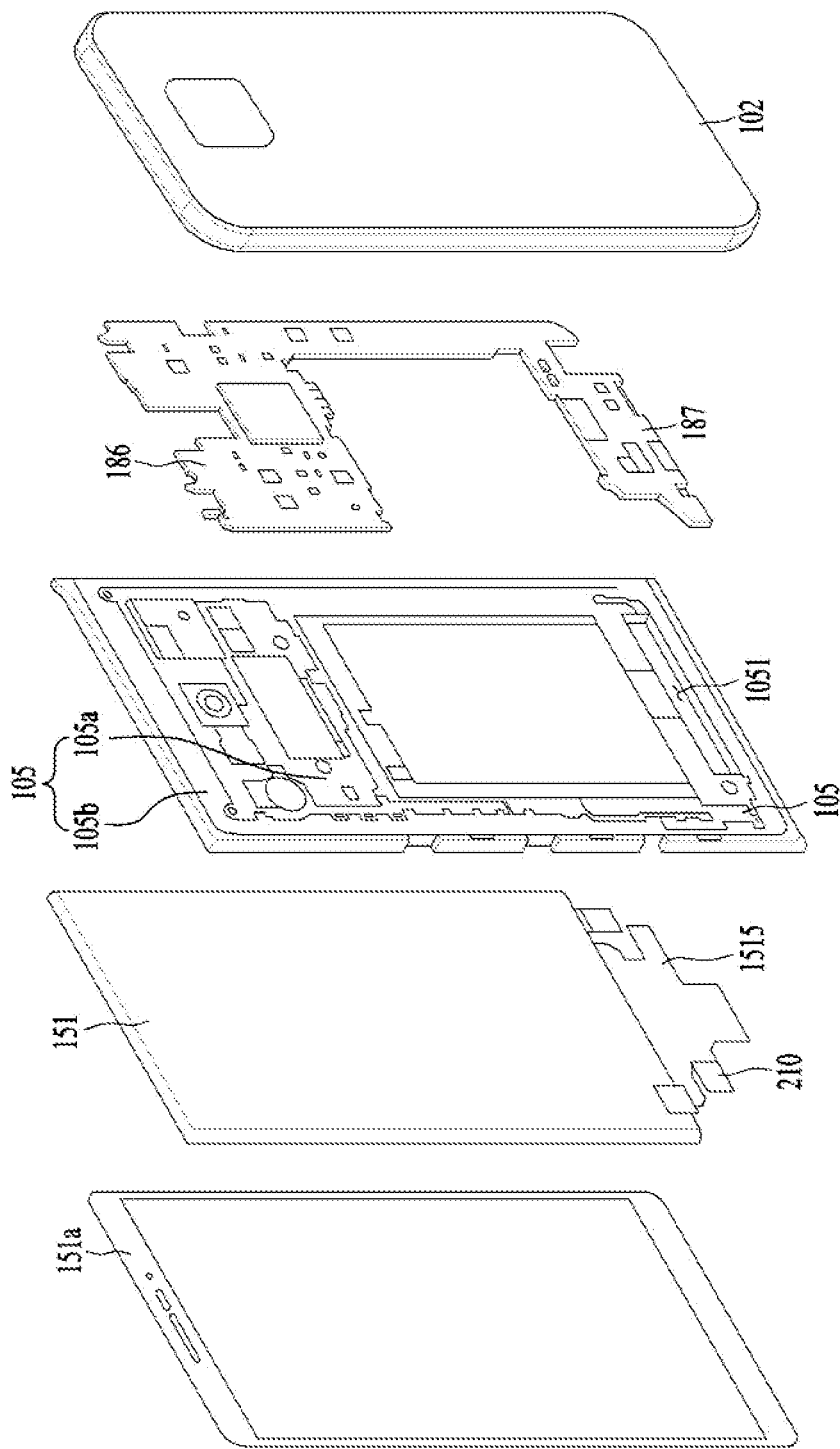

FIG. 4
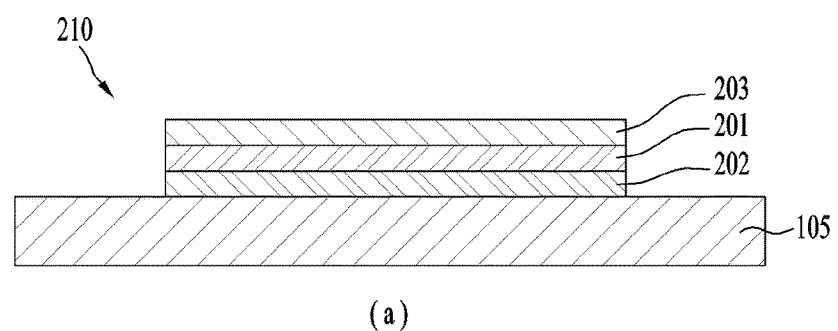
(a)
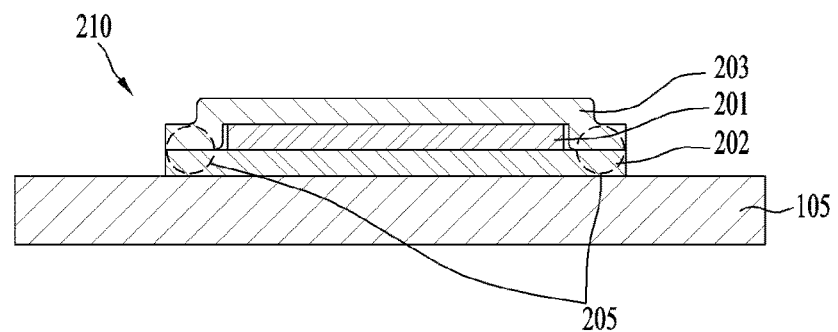
(b)

FIG. 6
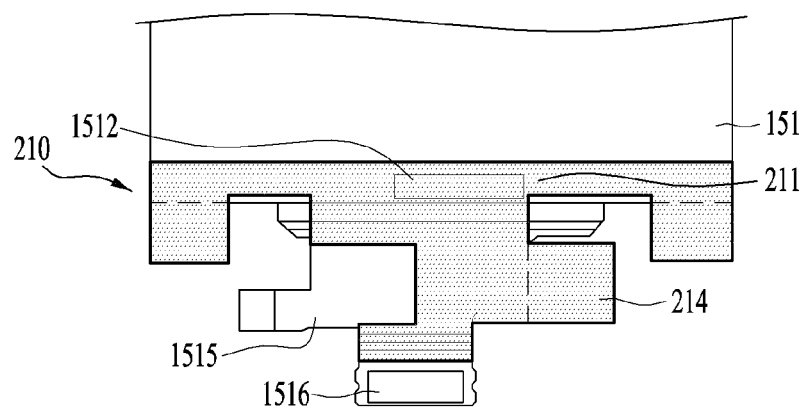
(a)
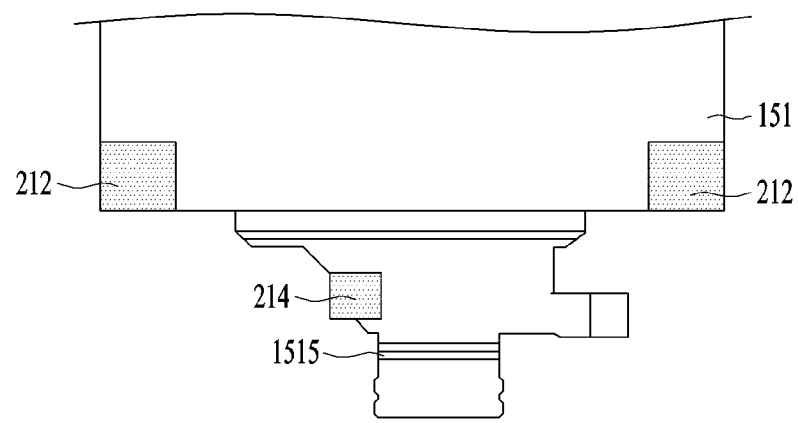
(b)

FIG. 8
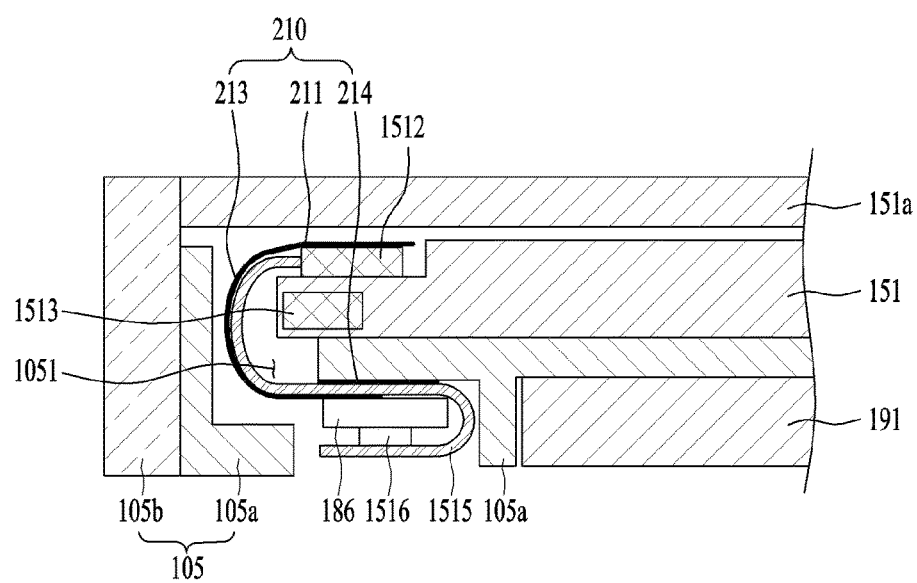
(a)
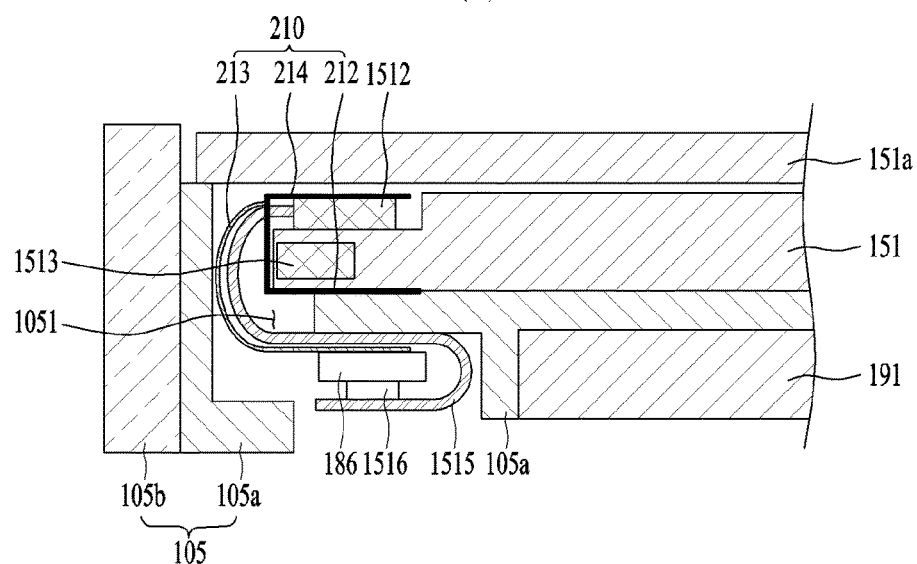
(b)

FIG. 9
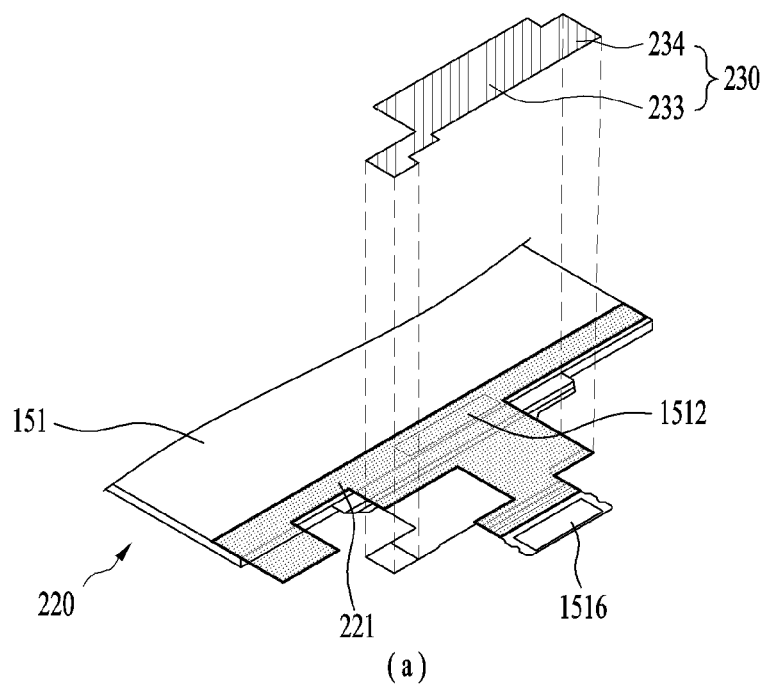
(a)
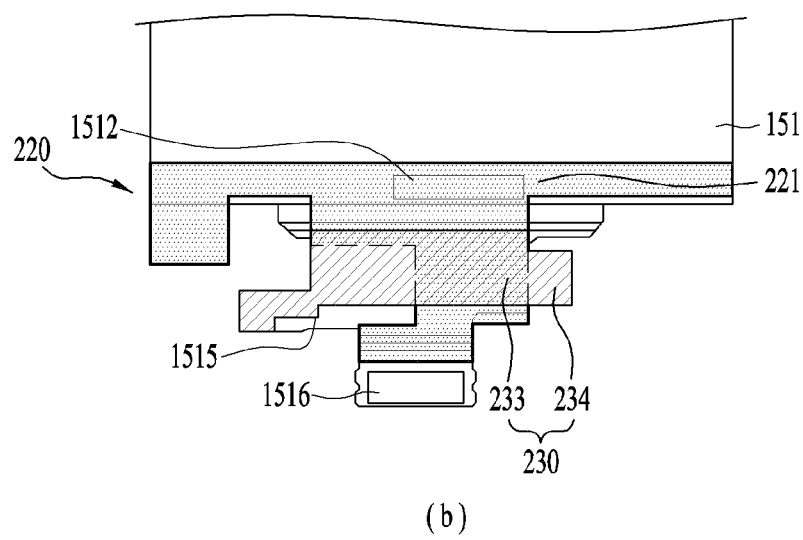
(b)

FIG. 11
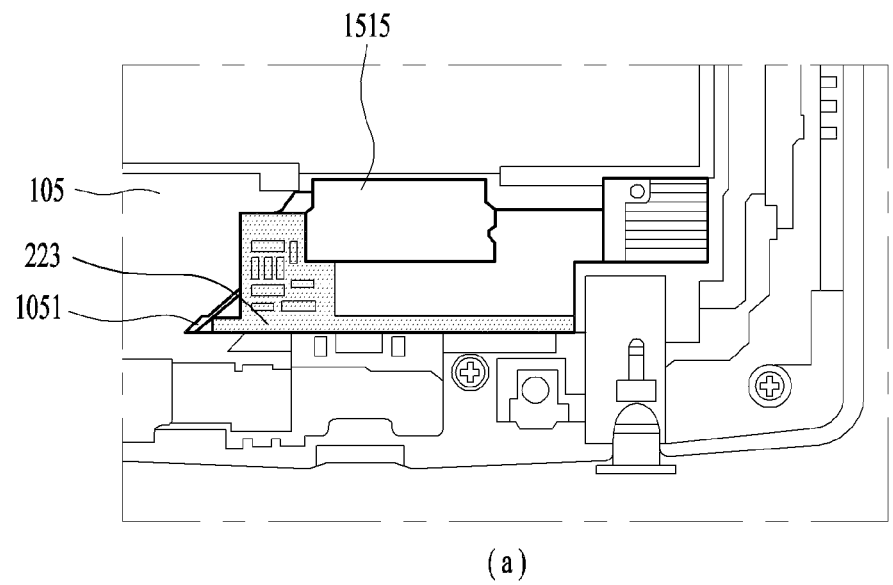
(a)
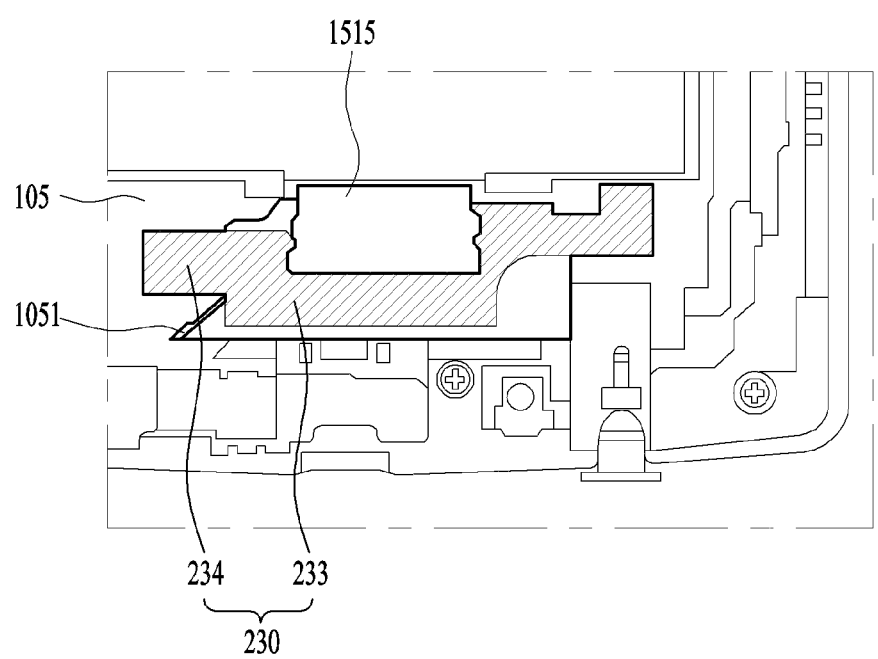
(b)

FIG. 12
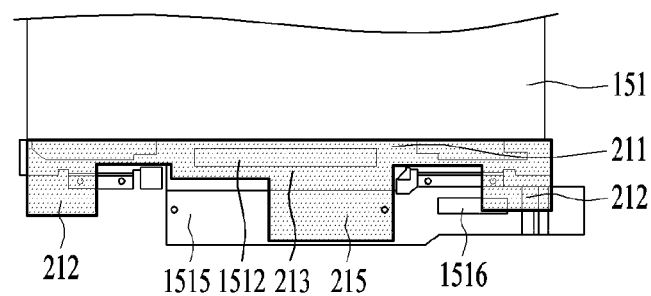
(a)
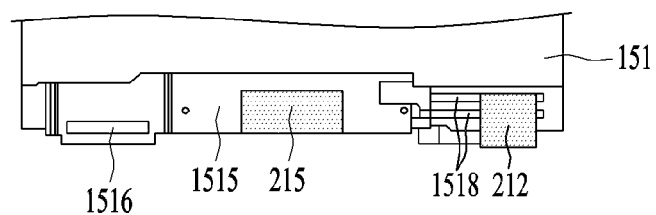
(b)

FIG. 14
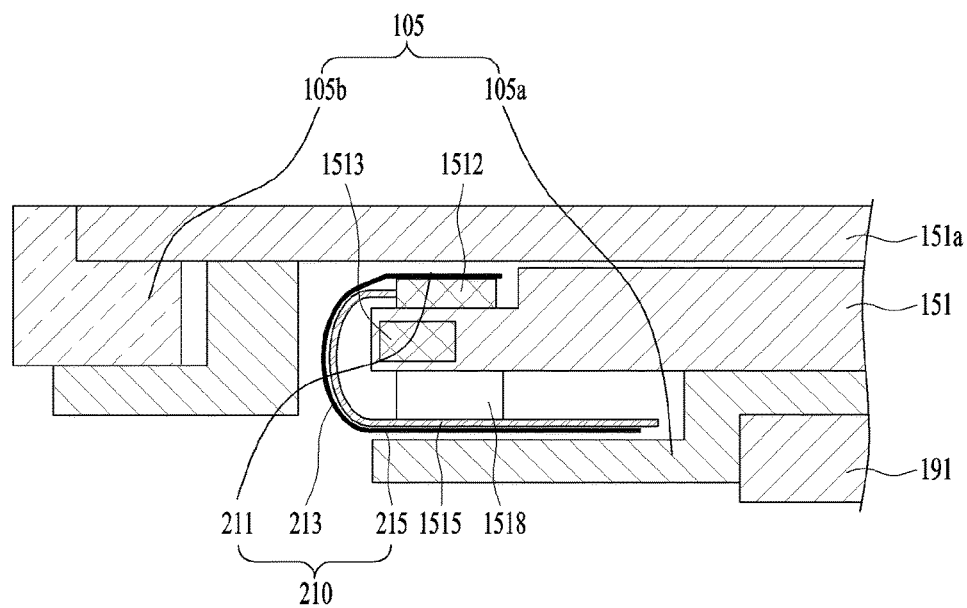
(a)
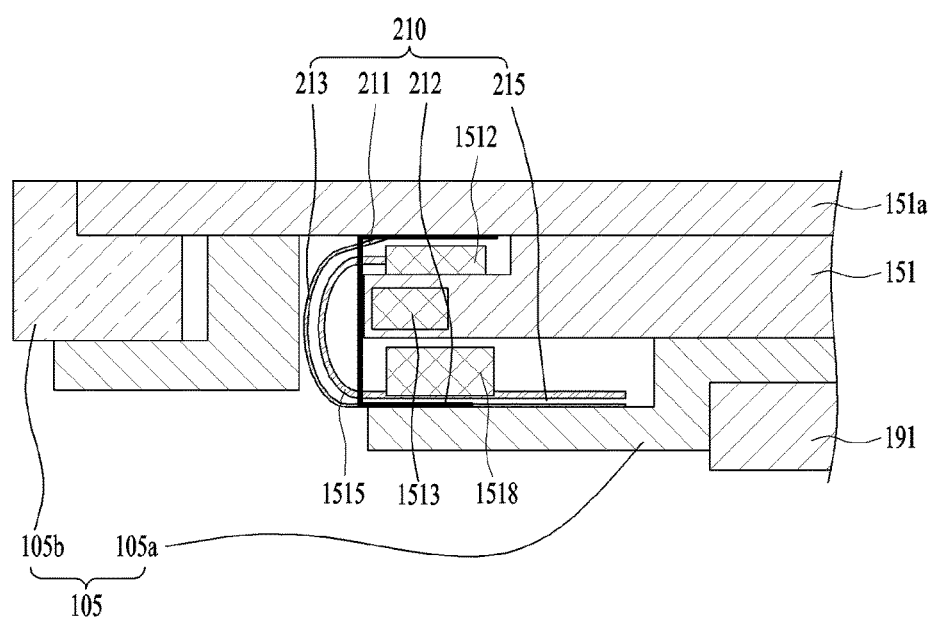
(b)

FIG. 15
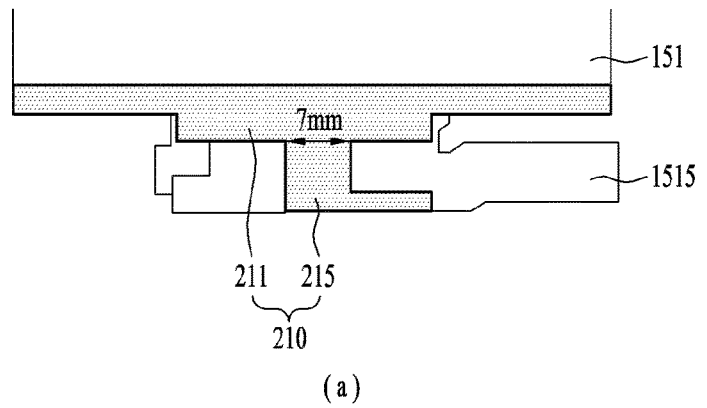
(a)
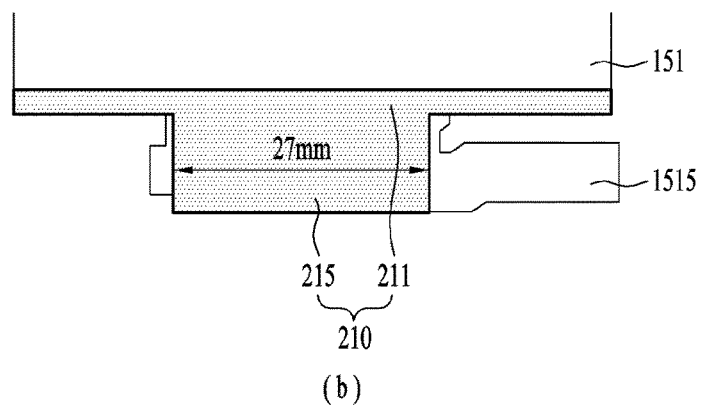
(b)
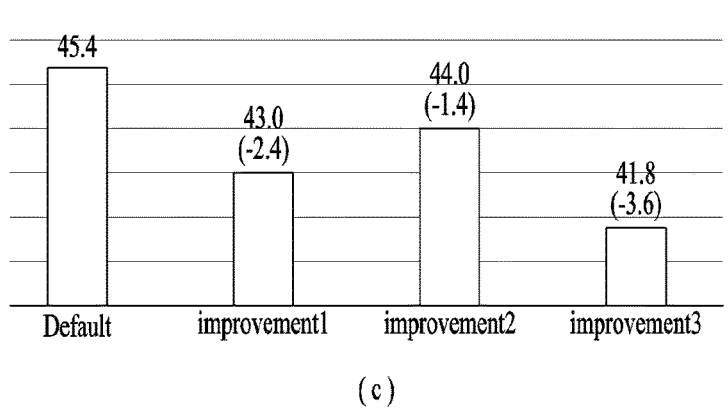
(c)

MOBILE TERMINAL

CROSS-REFERENCE TO RELATED APPLICATIONS

Pursuant to 35 U.S.C. §119(a), this application claims the benefit of earlier filing date and right of priority to Korean Patent Application No(s). 10-2015-0093900, filed on Jul. 1, 2015, the contents of which are all hereby incorporated by reference herein in its(their) entirety.

BACKGROUND OF THE DISCLOSURE

Field of the Disclosure

Embodiments of the present disclosure relate to a mobile terminal which may reduce or relieve local overheat by dispersing the heat generated in a display unit provided therein.

Background of the Disclosure

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

As such the multimedia functions become diversified and strengthened, hours of display unit usage are increasing. Accordingly, local heat is generated in a driving IC or backlight unit provided in a display unit.

Such local heat could result in deteriorating performance of components provided in the mobile terminal. Also, while holding the mobile terminal, the user might feel heat and the heat might interfere in the usage of the mobile terminal disadvantageously. Accordingly, there are needs for the structure configured to effectively sink the heat generated locally.

SUMMARY OF THE DISCLOSURE

An object of the present disclosure is to provide a mobile terminal including a structure configured to disperse the heat generated in a display unit.

Embodiments of the present disclosure may provide a mobile terminal including a display unit comprising a drive IC provided on the display unit; a frame provided in a rear surface of the display unit; a flexible printed circuit board having a first portion connected to the drive IC of the display unit and a second portion bent toward the rear surface of the display unit; a main board coupled to the frame and configured to control the drive IC via the flexible printed circuit board; and a heat transfer sheet configured to cover the drive IC and a portion of a first surface of the flexible printed circuit board, wherein at least a portion of the heat transfer sheet is in contact with the frame.

The frame may include a hole formed corresponding to one end of the display unit, and the second portion of the flexible printed circuit board penetrates the hole and the second portion of the flexible printed circuit board may be provided in the rear surface of the frame.

The heat transfer sheet may include a heat absorbing portion disposed on the drive IC; and a heat radiating portion in contact with the frame.

The heat radiating portion may include a first heat radiating portion extended from the heat absorbing portion and bend toward the rear surface of the display unit.

The heat transfer sheet may further include a heat transfer portion extended from the heat absorbing portion to the second portion of the flexible circuit board and disposed on the first surface of the flexible printed circuit board, and the heat radiating portion may include a second heat radiating portion extended from the heat transfer portion and projected in a lateral direction of the flexible printed circuit board.

The second heat radiating portion may be bent toward a second surface of the flexible printed circuit board and provided between the second surface of the flexible printed circuit board and the rear surface of the frame.

The second heat radiating portion may be bent toward the rear surface of the frame, together with the second portion of the flexible printed circuit board, contacts with the rear surface of the frame.

The second portion of the flexible printed circuit board may be provided between the frame and the display unit, and the heat transfer sheet may further include a thermal dispersing portion extended from the heat absorbing portion to the second portion of the flexible printed circuit board and disposed on the first surface of the flexible printed circuit board, and the heat radiating portion may include a third heat radiating portion extended from the heat dispersing portion and provided between the frame and the flexible printed circuit board.

The

The heat transfer sheet may include a first heat transfer sheet comprising a heat absorbing portion disposed on the front surface of the display unit and a first heat transfer portion extended from the heat absorbing portion and disposed on the first surface of the flexible printed circuit board; and a second heat transfer sheet comprising a second heat transfer portion overlapped with the first heat transfer sheet and a heat radiating portion in contact with the frame.

The heat radiating portion may include a fourth heat radiating portion projected from the second heat transfer portion in a lateral direction of the flexible printed circuit board, and the fourth heat radiating portion may be in contact with the rear surface of the frame.

The fourth heat radiating portion may be bent toward the second surface of the flexible printed circuit board and provided between the second surface of the flexible printed circuit board and the rear surface of the frame.

The mobile terminal may further include a bracket provided in a space, extended in a lateral direction, and configured to support a portion of the rear surface of the display unit, wherein the frame further comprising a recess portion to form the space between the display and the recess portion.

The mobile terminal may further include a hole formed in the frame, wherein the second portion of the flexible printed circuit board is connected to the main board via the hole.

The mobile terminal may further include a connection configured to connect the flexible printed circuit board to the main board, wherein the second portion of the flexible printed circuit board is provided in the rear surface of the frame and bent one time to form the third portion, and wherein the connection board provided between the second portion and third portion of the flexible printed circuit board.

The heat transfer sheet may include a graphite sheet or a copper sheet.

The mobile terminal may further include a thermal conductive adhesive layer provided between the graphite sheet or the copper sheet and the frame or the drive IC.

The heat transfer sheet may further include an adhesive layer or a protection layer disposed on each of both surfaces of the graphite sheet or the copper sheet and larger than the graphite sheet or the copper sheet, and wherein the circumference of the adhesive layers or the protection sheets contact each other at a circumference of the graphite sheet or the copper sheet.

BRIEF DESCRIPTION OF THE DRAWINGS

The present invention will become more fully understood from the detailed description given herein below and the accompanying drawings, which are given by illustration only, and thus are not limitative of the present invention, and wherein:

FIG. 1A is a block diagram of a mobile terminal in accordance with the present disclosure.

FIGS. 2 and 3 are exploded perspective diagrams illustrating one example of the mobile terminal in accordance with the present disclosure;

FIG. 4 is a sectional diagram illustrating a multilayered structure of a heat transfer sheet provided in the mobile terminal in accordance with the present disclosure;

FIG. 6 is a diagram illustrating a front surface and a rear surface which are seen when the display unit and the heat transfer sheet shown in FIG. 5 are coupled to each other;

FIG. 8 is a sectional diagram along A-A of FIG. 7 and B-B of FIG. 6;

FIG. 9 is a diagram illustrating a display unit and a heat transfer sheet provided in another example of the mobile terminal in accordance with the present disclosure;

FIG. 11 is a diagram illustrating one example that a second heat transfer sheet is coupled after the display unit and the frame of another example of the mobile terminal are coupled to each other;

FIG. 12 is a front and back view illustrating a display unit and a heat transfer sheet provided in a further example of the mobile terminal in accordance with the present disclosure;

FIG. 14 is a sectional diagram along C-C of FIG. 13 and D-D of FIG. 6; and

FIG. 15 is a diagram and a graph explaining an effect according to the width of the heat transfer sheet of the mobile terminal in accordance with the present disclosure.

DESCRIPTION OF SPECIFIC EMBODIMENTS

Figure 1B:
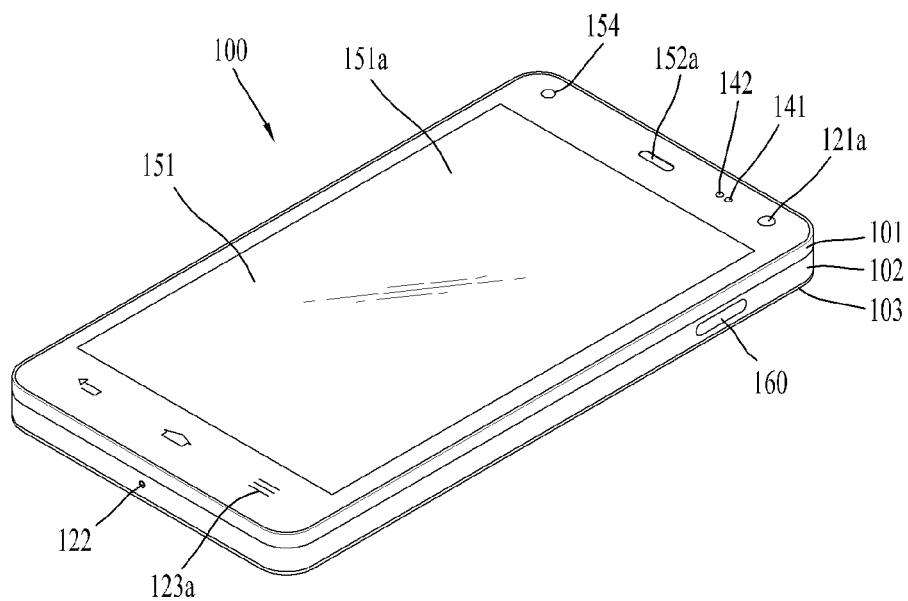
FIGS. 1B and 1C are conceptual views of one example of the mobile terminal, viewed from different directions.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1C:
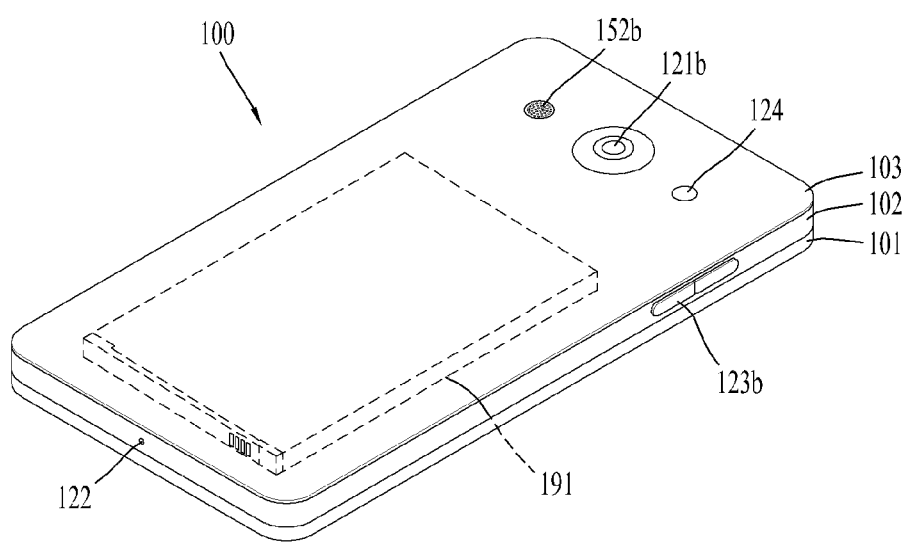

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

Referring now to FIG. 1A, the mobile terminal 100 is shown having wireless communication unit 110 configured with several commonly implemented components. For instance, the wireless communication unit 110 typically includes one or more components which permit wireless communication between the mobile terminal 100 and a wireless communication system or network within which the mobile terminal is located.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs.

The controller 180 may provide or process information or functions appropriate for a user by processing signals, data, information and the like, which are input or output by the various components depicted in FIG. 1A, or activating application programs stored in the memory 170. As one example, the controller 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

FIGS. 1B and 1C depict certain components as arranged on the mobile terminal.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170. The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

As shown in FIG. 1C, a flash 124 is shown adjacent to the second camera 121b. When an image of a subject is captured with the camera 121b, the flash 124 may illuminate the subject.

As shown in FIG. 1B, the second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

FIGS. 2 and 3 are exploded perspective diagrams illustrating one example of the mobile terminal 100 in accordance with the present disclosure. FIG. 2 is an exploded perspective diagram, viewed from a front direction and FIG. 3 is an exploded perspective diagram, viewed from a rear direction.

The mobile terminal in accordance with the present disclosure includes a window 151a, a display unit 151, a flexible printed circuit board 1515, a heat transfer sheet 210, a frame 105, a main printed circuit board 186, a battery 191 and a rear case 102.

The window 151a is configured to cover a front surface of the display unit 151 and the display unit 151 is configured to output image information, as mentioned above. Examples of the display unit may include one or more of a liquid crystal display (LCD), a thin film transistor-liquid crystal display (TDF LDE), an organic light-emitting diode (OLED), a flexible display, a 3D display and an e-ink display.

The display unit 151 emits color light designated for each pixel and provides an image, when pixels are provided with the electric power. A drive (C 1512 controls each of the pixels arranged in the display unit 151. The drive IC 1512 may be mounted on an auxiliary printed circuit board, connected to the display 151. Or, the drive IC 1512 may be directly mounted on the display unit 151 as an on-chip type. The drive IC may be located in an upper or lower area of the display unit 151 to reduce the right and left size of the bezel provided in the on-chip type display unit 151. In this embodiment, the drive IC may be provided in the lower portion of the display unit and the present disclosure is not limited thereto. Accordingly, the drive IC may be an upper portion, a right portion or a left portion of the display unit.

The drive IC 1512 is continuously driving while the display unit 151 is used. In case the display unit 151 displays substantially many frames of the video 105 or it is used for a long time, the heat generated in the drive IC 1512 results in increasing more and more disadvantageously.

Especially, when the display unit 151 is a liquid crystal display (LCD), a back light unit (BLD) arranged from a back surface of a liquid crystal panel. Such a back light unit of the mobile terminal 100 includes a liquid guide plate arranged in the back surface of the liquid crystal panel and a light source 1513 configured to emit light in a lateral direction with respect to the light guide plate.

The light source 1513 has to be arranged in an outer area with respect to the area where the image of the display unit 151 is output, so that it can be provided in an upper or lower area of the display unit 151 to prevent the right and left size of the bezel from increasing. The bezel means the edge area of the front surface along the image output area. A light emitting diode (LED) configured to emit light may be used as the light source 1513. Accordingly, when it is used for a long time, the LED is used as the light source 1513 and heat is generated from the light source 1513.

In case the drive IC 1512 and the light source 1513 are arranged in the same area (e.g., the upper or lower area of the display unit), the local heat generated in the area having the drive IC 1512 and the light source 1513 might be a more serious disadvantage.

The flexible printed circuit board 515 is configured to connect the drive IC 1512 and the main board 186 with each other, so that a control signal for driving the display unit can be transmitted from an application processor of the main board 186 to the drive IC 1512 via the flexible printed circuit board 515.

One predetermined side of the flexible printed circuit board 1515 is coupled to one end of the display unit 151 where the drive IC 1512 is arranged and the other side of the flexible printed circuit board 1515 is connected to the main board 186. A connector 1516 is provided in the other end of the flexible printed circuit board 1515 to be connected to the main board 1516. The flexible printed circuit board 1515 may be flexible easily and smoothly and the other side of the flexible printed circuit board is bent toward the rear surface of the display unit 151 to be connected to the main board 186.

The frame 105 is formed of a solid material and it is arranged in the rear surface of the display unit 151 to support the display unit 151. As the display unit 151 becomes thinner than the conventional display unit 151, the structure for supporting the display unit 151 becomes omitted and the rigidity of the display unit 151 deteriorates disadvantageously.

A hole 1051 shown in FIGS. 2 and 3 may be formed to penetrate the flexible printed circuit board 1515 connecting the display unit 151 disposed on the front surface of the frame 105 and the main board 186 disposed on the rear surface of the frame 105 with each other there through.

The frame 105 may be formed of a material with a stronger rigidity than the case 101 and 102 for the rigidity of the mobile terminal 100. For example, the frame 105 may include a metallic material such as magnesium. Such the metallic frame 105 has a stronger rigidity and an electric conductivity. Accordingly, the frame 105 may be used in grounding of electronic components such as an antenna.

In addition, the frame 105 has a high thermal conductivity and the local heat generated in the application processor of the mobile terminal 100 may be dispersed. A heat transfer sheet 210 may be used as a material for thermally connecting the drive IC 1512 and the frame 105 with each other so as to disperse the heat generated in the drive IC of the display unit 151, using the frame 105.

The heat transfer sheet 210 may be formed of a material with a high thermal conductivity. Examples of the high terminal conductivity material include copper and graphite. The copper has a thermal conductivity of 390 W/mk which is higher than aluminum or an injection molding product. The copper formed as a thin sheet may be used as the heat transfer sheet 210.

A graphite sheet is processed at high temperatures of 2000° C. or more, with a light weight and a strong elasticity and a heat resistance. As the graphite has a good heat transfer ability in a lateral direction, heat can move along the graphite sheet rapidly.

FIG. 4 is a sectional diagram of the heat transfer sheet 210. Such the heat transfer sheet 210 has a layer structure configured of an adhesive layer 202, a heat transfer material 201 and a protection tape 203. (a) shows that the heat transfer material 201 has the same size as the protection tape 203 and (b) shows that the heat transfer material 201 is smaller than the protection tape 203. In (b), the protection tape 203 projected outer to the heat transfer material 201 is connected with the adhesive layer 202 at an end 205 and protects the heat transfer material 201 from being projected outside.

When the size of the heat transfer material 201 is equal to that of the protection tape 203 as shown in (a), the fabrication process can be simple and the size of the heat transfer sheet 210 can be reduced as much as possible. However, the metallic material such as copper is apt to corrode quickly and it has the electrical conductivity as well as the thermal conductivity. Accordingly, in case the end needs covering not to expose the heat transfer material 201, the structure shown in (b) is preferable.

Figure 5:
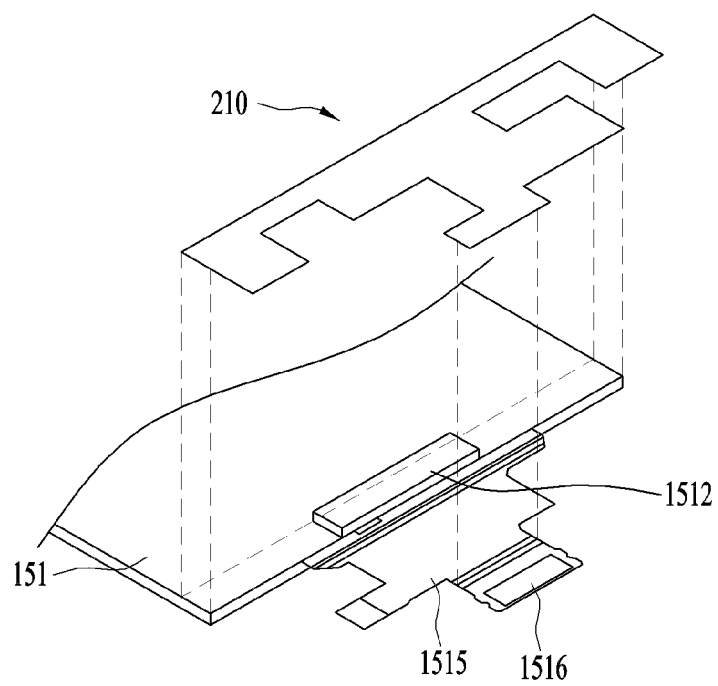
FIG. 5 is an exploded perspective diagram illustrating a display unit and a heat transfer sheet which are provided in one example of the mobile terminal in accordance with the present disclosure.

FIG. 5 is an exploded perspective diagram illustrating the display unit 151 and the heat transfer sheet 210 which are provided in one example of the mobile terminal 100 in accordance with the present disclosure. FIG. 6 is a diagram illustrating a front surface and a rear surface which are seen when the display unit 151 and the heat transfer sheet 210 shown in FIG. 5 are coupled to each other. (a) of FIG. 6 illustrates the front surface and (b) of FIG. 6 illustrates the rear surface.

A predetermined area of the heat transfer sheet 210 is disposed on the drive IC 1512 and the other area is in contact with the metallic portion of the frame 105, only to transfer the heat generated in the drive IC 1512 to the frame 105. The area in contact with the drive IC 1512 may be a heat absorbing portion 211 configured to absorb the heat and the area in contact with the frame 105 is a heat radiating portion 212 and 214 configured to radiate the heat to the frame 105.

A first heat radiating portion 212 provided between the display unit 151 and the frame 105 may contact with the front surface of the frame 105. The heat radiating portion 214 bent to the rear surface of the frame 105 may contact with the rear surface of the frame 105.

The heat absorbing portion 211 of the heat transfer sheet 210 may be disposed on the end area of the display unit 151, covering the drive IC 1512. At this time, the area where the heat transfer sheet 210 is disposed is the non-display area where no image information is output.

The heat radiating portion 212 and 214 of the heat transfer sheet 210 may be extended from the heat absorbing portion 211 from the heat absorbing portion 211. As shown in FIG. 5(*a*), the heat radiating portion 212 and 214 may be extended outer, not disposed on the display unit 151 or the flexible printed circuit board 1515. The heat radiating portion 212 and 214 shown in FIG. 5(*b*) is bent toward the rear surface of the display unit 151 or the rear surface of the flexible substrate 1515 to contact with the metallic frame 105 disposed on the rear surface of the display unit 151.

Figure 7:
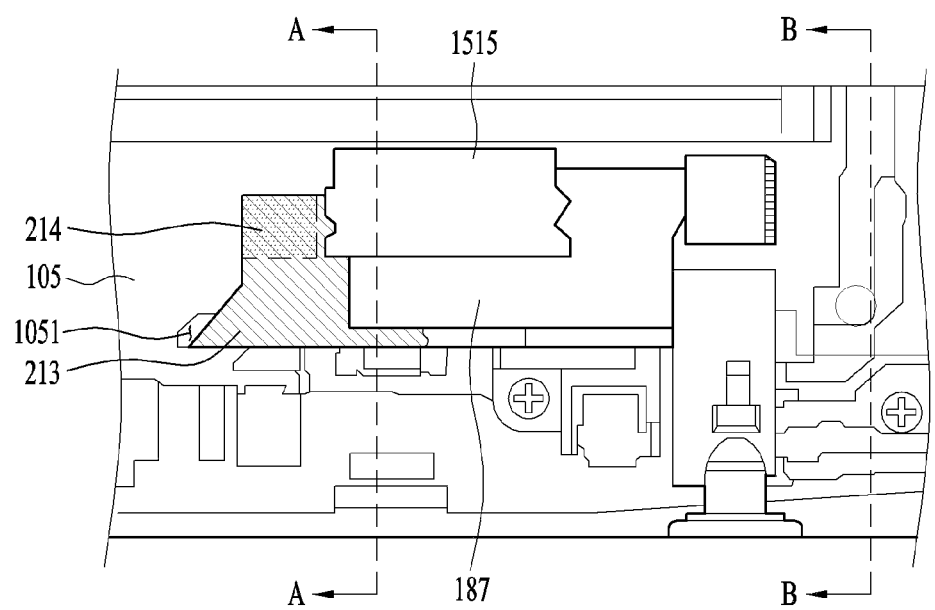
FIG. 7 is a diagram illustrating a rear surface seen when the display unit and a frame of the mobile terminal are coupled to each other.

FIG. 7 is a diagram illustrating a rear surface seen when the display unit 151 and the frame 105 of the mobile terminal 100 are coupled to each other. FIG. 8 is a sectional diagram along A-A of FIG. 7 and B-B of FIG. 6.

The first radiating portion 212 bent to the rear surface of the display unit 151 after extended from the display unit 151 may be bent in the rear surface of the flexible printed circuit board 1515, in close contact, as shown in FIG. 6(*b*). After that, the first radiating portion 212 is in contact with the front surface of the frame 105 as shown FIG. 8(*b*). In other words, the first heat radiating portion 212 may be provided between the frame 105 and the display unit 151.

The flexible printed circuit board 1515 penetrating the hole 1051 formed in the frame 105 is bent in "U" shape as shown in FIG. 7, so that it can contact with the rear surface of the frame 105. The second heat radiating portion 214 extended in a lateral direction of the flexible printed circuit board 1515 is bent to the rear surface of the flexible printed circuit board 1515, in close contact, as shown in FIG. 6(*b*). After that, the flexible printed circuit board 1515 may be in contact with the rear surface of the frame 105 as shown in FIG. 8(*a*).

The second heat radiating portion 214 extended in the lateral direction of the flexible printed circuit board 1515 may be bent to the rear surface of the flexible printed circuit board 1515, even when it is spread, not bent to the rear surface. Accordingly, the second heat radiating portion 214 may contact with the rear surface of the frame 105 even in the state of being spread as shown in FIG. 6(*a*). The surface where the second heat radiating portion 214 and the frame 105 are in contact with each other, in case the second heat radiating portion 214 is bent, may be is the reverse of the surface where they are in contact with each other, in case the second heat radiating portion 214 is spread.

The second heat radiating portion 214 is provided with the heat absorbed by the heat absorbing portion 211 via a heat transfer portion 213 of the heat transfer sheet 210 disposed on the flexible substrate 1515. After that, the heat transfer sheet 210 is disposed on the flexible printed circuit board 1515 and then this may ease the assembling process.

The connector 1516 provided in the other end of the flexible printed circuit board 1515 may be connected to the main board 186. When the main board 186 is located in the lower portion of the mobile terminal 100, the flexible printed circuit board 1515 may be directly connected to the main board 186. However, when the main board 186 is located in the upper portion of the mobile terminal 100, it is difficult to directly connect the flexible printed circuit board 1515 to the main board.

In this instance, a connection board 187 may be further provided in the lower portion of the mobile terminal 100 to act as an intermediary between the flexible printed circuit board 1515 and the main board 186. The connection board 187 may be disposed on the flexible printed circuit board 1515 bent to the rear surface of the frame 105, with the connector 1516 and a connecting portion arranged toward the rear surface of the mobile terminal 100.

In the mobile terminal 100 in accordance with this embodiment, the components are disposed on the front surface toward the rear surface sequentially. If the mount surface (i.e., an IC chip, the surface where the connector 1516 connected to another board is arranged) of the connection board 187 is assembled toward the frame 105, it could be difficult to connect the connection board 187 with other components such as the flexible printed circuit board 1515 extended from the display unit 151. Accordingly, the mount surface of the connection board 187 may be arranged toward the rear surface of the mobile terminal 100 as shown in FIG. 8.

To connect the connection board 187 having the mount surface arranged toward the rear surface to the connector 1516 of the flexible printed circuit board 1515, the other portion of the flexible printed circuit board 1515 is bent in the U-shape again as shown in FIG. 8.

FIG. 9 is a diagram illustrating a display unit 151 and a heat transfer sheet provided in another example of the mobile terminal in accordance with the present disclosure. In this embodiment, two heat transfer sheets are used.

The heat transfer sheet may include a first heat transfer sheet 220 having a heat radiating portion 221 covering a predetermined portion of the display unit 151 and a first heat transfer portion 223 disposed on one surface of the flexible printed circuit board 1515; and a second heat transfer sheet 230 disposed on one surface of the flexible printed circuit board 1515, overlapped with the first heat transfer sheet 220. The second heat transfer sheet 230 includes a second heat transfer portion 233 overlapped with the first heat transfer sheet 220 and a fourth heat radiating portion 234 in contact with the frame 105. Similar to the embodiments mentioned above, the heat radiating portion 212 and 214 of the heat transfer sheet 210 projected from the flexible printed circuit board 1515 is likely to damage or break during the distribution process. To solve the disadvantage, the first heat transfer sheet 220 not projected from the flexible printed circuit board 1515 is disposed on the display unit to complete a first process. Right before the frame 105 is coupled to the display unit 151, the second heat transfer sheet 230 is disposed to contact with the frame 105 and the damage to the heat transfer sheet may be then prevented.

When the second heat transfer sheet is disposed as shown in FIG. 9(*b*), the fourth heat radiating portion 234 is projected in a lateral direction of the flexible printed circuit board 1515. When the fourth heat radiating portion 234 is bent to the other surface of the flexible printed circuit board 1515, the fourth heat radiating portion 234 is located in the same position as the second heat radiating portion (214, see FIG. 7) of the embodiment mentioned above.

Figure 10:
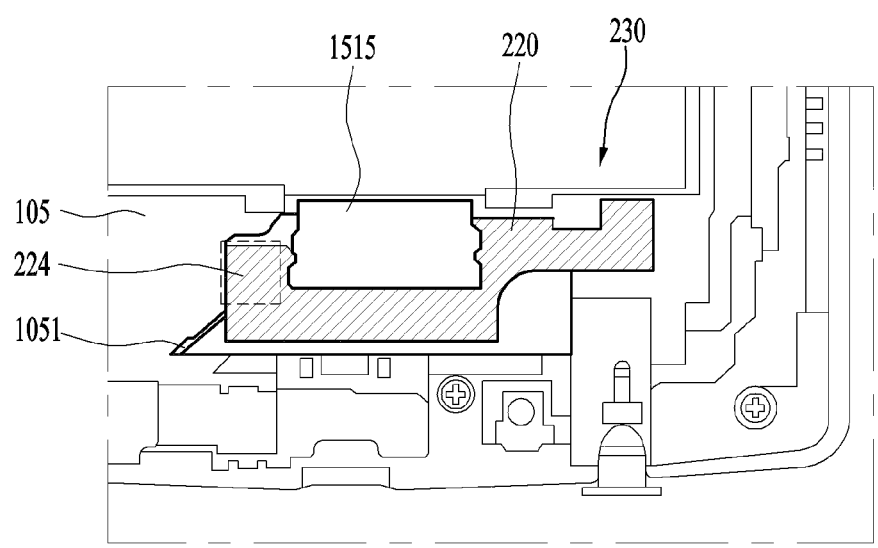
FIG. 10 is a diagram illustrating a rear surface seen when the display unit and the frame of FIG. 9 are coupled to each other.

FIG. 10 is a diagram illustrating a rear surface seen when the display unit 151 and the frame 105 of FIG. 9 are coupled to each other. The display unit 151 is coupled to the frame 105 and then the flexible printed circuit board 1515 is bent to be located toward the rear surface of the frame 105 via the hole of the frame 105. After that, the fourth heat radiating portion 234 may be located between the rear surface of the frame 105 and the other surface of the flexible printed circuit board 1515. In other words, the fourth heat radiating portion 234 may be arranged in the same position as the second heat radiating portion (214, see FIG. 8(b)) of the embodiment mentioned above.

FIG. 11 is a diagram illustrating one example that the second heat transfer sheet 230 is coupled after the display unit 151 and the frame 105 of another example of the mobile terminal are coupled to each other.

In the embodiment shown in FIGS. 9 and 10, the second heat transfer sheet 230 is disposed on the flexible printed circuit board 1515 before the frame 105 and the display unit 151 are coupled to each other. However, in this embodiment, the display unit 151 having the first heat transfer sheet 220 disposed thereon is coupled to the frame 105 and the flexible printed circuit board 1515 is bent toward the rear surface of the frame 105 via the hole 1051 of the frame 105, to be located in the position shown in FIG. 11(a). Hence, the connection board is disposed on the flexible printed circuit board 1515 and connected to the connector arranged in the other end of the flexible printed circuit board 1515. After that, the second heat transfer sheet 230 is disposed to contact with the rear surface of the frame 105, in contact with the first heat transfer sheet 220, as shown in FIG. 11(b).

In other words, the second heat transfer portion 233 of the second heat transfer sheet 230 covers the first heat transfer sheet 220 and the fourth heat radiating portion 234 is disposed on the rear surface of the frame 105. In the embodiment of FIG. 10 mentioned above, the fourth heat radiating portion 234 is arranged between the flexible circuit board 1515 and the frame 105. However, in this embodiment of FIG. 11(b), the fourth heat radiating portion 234 is not overlapped with the flexible printed circuit board 1515.

Figure 13:
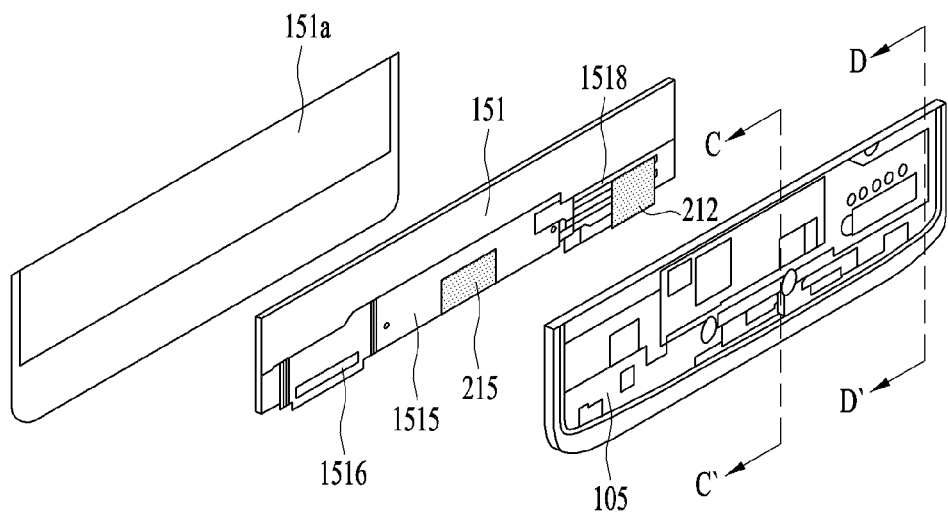
FIG. 13 is an exploded perspective diagram illustrating a lower portion of a further example of the mobile terminal in accordance with the present disclosure.

FIG. 12 is a front and back view illustrating a display unit 151 and a heat transfer sheet 210 provided in a further example of the mobile terminal 100 in accordance with the present disclosure. FIG. 13 is an exploded perspective diagram illustrating a lower portion of a further example of the mobile terminal 100 in accordance with the present disclosure. FIG. 14 is a sectional diagram along C-C of FIG. 13 and D-D of FIG. 6.

This embodiment shows the optimized structure when a component of the rear surface is mounted toward the front surface, different from the embodiments mentioned above. In the embodiments mentioned above, the other end of the flexible circuit board 1515 penetrates the hole formed in the frame 105 toward the rear surface of the frame 105. However, in this embodiment shown in FIG. 14, the other end of the flexible circuit board 1515 is arranged in the front surface of the frame 105.

As the flexible printed circuit board 1515 is disposed on the front surface of the frame 105, the surface of the flexible printed circuit board 1515 in contact with the frame 105 is the reverse of the surface mentioned in the embodiments of FIGS. 5 through 8. Accordingly, the third heat radiating portion 215 is not extended from the flexible printed circuit board 1515 but disposed on the flexible printed circuit board 1515. As shown in FIG. 12(b) and FIG. 13, the flexible printed circuit board 1515 is bent toward the rear surface of the frame and the third heat radiating portion 215 is arranged in the area facing the frame 105.

In this embodiment, the other end of the flexible printed circuit board 1515 is arranged between the display unit 151 and the frame 105, so that a predetermined space can be provided between the frame 105 and one end of the display unit 151. As shown in FIG. 8, the frame 105 has a recess portion recessed toward the rear surface from the position corresponding to one end of the display unit 151 and the flexible printed circuit board 1515 may be provided in the recessed space. In this instance, the force of the frame 105 supporting the display unit 151 is weakened. Accordingly, a bracket 1518 may be further provided in a predetermined portion of the rear surface of the display unit 151 to support the display unit 151. A bar-shaped material may be used as the bracket 1518 shown in FIG. 8 and the bracket supports the portion of the rear surface of the display unit 151 which is not supported by the frame 105.

The first heat radiating portion 212 bent toward the rear surface of the display unit 151 after extended from the display unit 151 may be arranged in the direction toward the rear surface of the bracket 1518, to contact with the frame 105. When the bracket 1518 has a high thermal conductivity, the first heat radiating portion 212 may be provided between the bracket 1518 and the display unit 151.

In this embodiment, the connecting portion of the main board 186 connected to the display unit 151 may be provided in a lateral direction of the mobile terminal 100 in accordance with this embodiment and the connector 1516 provided in the end of the flexible printed circuit board 1515 is set aside in a lateral direction of the flexible circuit board 1515.

FIG. 15 is a diagram and a graph explaining an effect according to the width of the heat transfer sheet 210 of the mobile terminal 100 in accordance with the present disclosure. The graph of (c) shows temperatures in the lower portion of the mobile terminal 100. As the temperature in the lower portion is getting lower, the dispersion efficiency of the heat generated in the drive IC 1512 and the light source 1513 is getting higher.

Default refers to a case of not using the heat transfer sheet 210. Improvement 1 refers a case of using graphite as the heat transfer material 201, with the heat radiating portion having the width of 7 mm shown in FIG. 15(a). Improvement 2 refers to a case of using copper as the heat transfer material 201, with the heat radiating portion having the width of 7 mm shown in FIG. 15(a). Improvement 3 refers to a case of using graphite as the heat transfer material 201, with the heat radiating portion having the width of 27 mm shown in FIG. 15(b).

Graphite has a higher thermal conductivity than copper so that it has the more improved heat radiation efficiency. As the heat radiating portion becomes wider and wider, the area in contact with the frame 105 becomes wider and wider and the heat radiation efficiency is enhanced.

According to at least one of the embodiments mentioned above, the heat generated in the drive IC 1512 and the light source of the display unit 151 may be transferred to the frame 105. Accordingly, the performance deterioration of the mobile terminal caused by the local overheat may be reduced and the difficulty in the user's holding the mobile terminal may be also reduced.

The computer may include the controller 180 of the mobile terminal. Accordingly, the description and embodiments should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mobile terminal comprising:
   a display comprising a drive integrated circuit (IC);
   a frame positioned relative to a rear side of the display;
   a flexible printed circuit board having a first portion connected to the drive IC of the display and a second portion bent toward the rear side of the display;
   a main board coupled to the frame and configured to control the drive IC via the flexible printed circuit board; and
   a heat transfer sheet positioned to cover the drive IC and a portion of a first surface of the flexible printed circuit board,
   wherein at least a portion of the heat transfer sheet is in contact with the frame.

2. The mobile terminal of claim 1, wherein the frame is shaped to define a hole at a location that generally corresponds to one end of the display, and
   wherein the second portion of the flexible printed circuit board is received within the hole and the second portion of the flexible printed circuit board is located at a rear side of the frame.

3. The mobile terminal of claim 1, wherein the heat transfer sheet comprises:
   a heat absorbing portion located on the drive IC; and
   a heat radiating portion in contact with the frame.

4. The mobile terminal of claim 3, wherein the heat radiating portion comprises:
   a first heat radiating portion extending from the heat absorbing portion and bent toward the rear side of the display.

5. The mobile terminal of claim 3, wherein the heat transfer sheet further comprises:
   a heat transfer portion extending from the heat absorbing portion toward the second portion of the flexible printed circuit board and located on the first surface of the flexible printed circuit board, and
   wherein the heat radiating portion comprises:
   a second heat radiating portion extending from the heat transfer portion and projecting in a lateral direction of the flexible printed circuit board.

6. The mobile terminal of claim 5, wherein the second heat radiating portion is bent toward a second surface of the flexible printed circuit board and located between the second portion of the flexible printed circuit board and a rear side of the frame.

7. The mobile terminal of claim 5, wherein the second heat radiating portion is bent toward a rear side of the frame, together with the second portion of the flexible printed circuit board, and contacts the rear side of the frame.

8. The mobile terminal of claim 3, wherein the second portion of the flexible printed circuit board is located between the frame and the display, and
   the heat transfer sheet further comprises a thermal dispersing portion extending from the heat absorbing portion toward the second portion of the flexible printed circuit board and located on the first surface of the flexible printed circuit board, and
   the heat radiating portion comprises a third heat radiating portion extending from the heat dispersing portion and provided between the frame and the flexible printed circuit board.

9. The mobile terminal of claim 8, wherein the frame further comprises a recess portion that forms a space between the display and the recess portion, and wherein the mobile terminal further comprises:
   a bracket located in the space of the recess and extending in a lateral direction supporting a portion of the rear side of the display.

10. The mobile terminal of claim 8, wherein the frame is shaped to define a hole, and wherein the second portion of the flexible printed circuit board is connected to the main board via the hole.

11. The mobile terminal of claim 1, wherein the heat transfer sheet comprises:
    a first heat transfer sheet comprising a heat absorbing portion located on a front side of the display and a first heat transfer portion extended from the heat absorbing portion and disposed on the first surface of the flexible printed circuit board; and
    a second heat transfer sheet comprising a second heat transfer portion overlapped with the first heat transfer sheet and a heat radiating portion in contact with the frame.

12. The mobile terminal of claim 11, wherein the heat radiating portion comprises:
    a fourth heat radiating portion projecting from the second heat transfer portion in a lateral direction of the flexible printed circuit board, and wherein
    the fourth heat radiating portion is in contact with a rear surface of the frame.

13. The mobile terminal of claim 12, wherein the fourth heat radiating portion is bent toward the second surface of the flexible printed circuit board and provided between the second surface of the flexible printed circuit board and the rear surface of the frame.

14. The mobile terminal of claim 1, further comprising:
    a connection board connecting the flexible printed circuit board to the main board,
    wherein the second portion of the flexible printed circuit board is located at a rear side of the frame and bent to form the third portion, and
    wherein the connection board is located between the second portion and a third portion of the flexible printed circuit board.

15. The mobile terminal of claim 1, wherein the heat transfer sheet comprises a graphite sheet or a copper sheet.

16. The mobile terminal of claim 15, further comprising:
    a thermal conductive adhesive layer located between the graphite sheet or the copper sheet and the frame or the drive IC.

17. The mobile terminal of claim 16, wherein the heat transfer sheet further comprises:
    an adhesive layer or a protection layer located on both surfaces of the graphite sheet or the copper sheet and is larger than the graphite sheet or the copper sheet, and
    wherein a circumference of the adhesive layer or the protection sheet contacts each other at a circumference of the graphite sheet or the copper sheet.

* * * * *